(12) United States Patent
Kalb

(10) Patent No.: US 6,714,076 B1
(45) Date of Patent: Mar. 30, 2004

(54) BUFFER CIRCUIT FOR OP AMP OUTPUT STAGE

(75) Inventor: Arthur J. Kalb, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/272,172

(22) Filed: Oct. 15, 2002

Related U.S. Application Data

(60) Provisional application No. 60/330,043, filed on Oct. 16, 2001.

(51) Int. Cl.[7] .................................................. H03F 3/45
(52) U.S. Cl. ...................... 330/255; 330/262; 330/263; 330/267; 330/288
(58) Field of Search ................................. 330/255, 262, 330/263, 267, 288

(56) References Cited

U.S. PATENT DOCUMENTS 6,392,485 B1   5/2002   Doi et al. .................... 330/253

FOREIGN PATENT DOCUMENTS

JP   4356807   12/1992

OTHER PUBLICATIONS

Mucha "Thousand and one improvements on current operational amplifiers" 1994 IEEE International Symposium on Circuits and Systems vol. 5, May 30 to Jun. 2, 1994 pp 533–536.

A Quad CMOS Single–Supply of Amp with Rail–to–Rail Output Swing, Dennis M. Monticelli, IEEE Journal of Solid–State Circuits, vol. SC–21, No. 6, (Dec. 1986),pp. 1026–1034.

*Primary Examiner*—Michael B. Shingleton
(74) *Attorney, Agent, or Firm*—Koppel, Jacobs, Patrick & Heybl

(57) ABSTRACT

An op amp includes a pair of buffer amplifiers interposed between the current switch and the output transistors in an output stage based on the Monticelli architecture. The buffer amps buffer the output transistors' gate capacitances, thereby allowing the output transistors to be nearly any desired size without adversely affecting the op amp's dynamic performance. This enables the op amp's compensation capacitors to set the amplifier's bandwidth, and allows the secondary pole to be at a higher frequency. The buffer amplifiers can also provide gain which effectively multiplies the transconductance of the output transistors and further extends out the secondary pole location. In addition, the buffer amplifiers can be used to provide voltage level translation between the current switch and output transistors, which can provide additional headroom for the op amp's gain stage.

26 Claims, 4 Drawing Sheets

BUFFER CIRCUIT FOR OP AMP OUTPUT STAGE

REFERENCE TO EARLIER APPLICATIONS

This application claims the benefit of provisional patent application Ser. No. 60/330,043 to Kalb, filed Oct. 16, 2001.

BACKGROUND OF THE INVENTION

1. Field of the Invention

This invention relates to the field of operational amplifiers (op amps), and particularly to the op amp output stages.

2. Description of the Related Art

An op amp typically includes an input stage which produces a differential current in response to the application of a differential input voltage, and an output stage which produces a single-ended or differential output which varies with the differential current. An example is shown in FIG. 1. The input stage 10 comprises PMOS transistors MP1 and MP2, and a tail current source 12. A differential input voltage is applied across the gates of MP1 and MP2, and a differential current is produced at their drain terminals in response.

The differential current is connected to a gain stage 14—typically comprising a number of transistors connected in a folded-cascode configuration (biased with bias voltages $V_{b3}$, $V_{b4}$, and $V_{b5}$)—which drives an output stage 15. The output stage in FIG. 1 is arranged in what is sometimes called a "Monticelli architecture", described, for example, in Monticelli, "A Quad CMOS Single-Supply Op Amp with Rail-to-Rail Output Swing," Journal of Solid-State Circuits, December 1986, pp. 1026–1034, which features a current switch 16 that drives a pair of output transistors MP3 and MN1 connected in a back-to-back common-source configuration. The op amp's output 17 is taken at the junction 17 of MP3 and MN1. The current switch comprises an NMOS transistor MN2 and a PMOS transistor MP4, which receive respective bias voltages $V_{b1}$ and $V_{b2}$ and are connected between a pair of nodes 18 and 20. Nodes 18 and 20 are connected to receive the differential current from gain stage 14. When properly biased, MN2 and MP4 conduct equal currents when the differential current is zero. The voltages developed at nodes 18 and 20 drive output transistors MP3 and MN1, respectively. Output stage 15 typically includes a frequency compensation scheme. One of many possible schemes is shown in FIG. 1, with a first compensation capacitor C1 connected between node 18 and junction 17, and a second compensation capacitor C2 connected between node 20 and junction 17.

This circuit arrangement suffers from a number of drawbacks, however. The gate capacitances of output transistors MP3 and MN1 can affect the dominant pole in the op amp's frequency response, which can make the amplifier's bandwidth dependent on the output transistors used. The gate capacitances can also lower the frequency of the op amp's secondary pole, which establishes the bandwidth's upper limit. These problems can be particularly troublesome when the output transistors are external field-effect transistors (FETs), which typically have higher gate capacitances.

SUMMARY OF THE INVENTION

An op amp output stage is presented which overcomes the problems noted above. The adverse affects of gate capacitance on the amplifier's dynamic performance are mitigated, and other benefits are realized as well.

The present invention includes a pair of buffer amplifiers which are interposed between the current switch and the output transistors in a Monticelli-based output stage. The buffer amps act to buffer the output transistors' gate capacitance, thereby allowing the output transistors to be any desired size without adversely affecting the op amp's dynamic performance. This enables the op amp's compensation capacitors to set the amplifier's bandwidth. It also moves the secondary pole to a higher frequency. The buffer amplifiers can also provide gain, which effectively multiplies the transconductance of the output transistors and further extends out the secondary pole location.

In addition, the buffer amplifiers can be used to provide level translation between the current switch and the output transistors, which can provide additional headroom for the amplifier's gain stage.

Further features and advantages of the invention will be apparent to those skilled in the art from the following detailed description, taken together with the accompanying drawings.

DETAILED DESCRIPTION OF THE INVENTION

Figure 2:
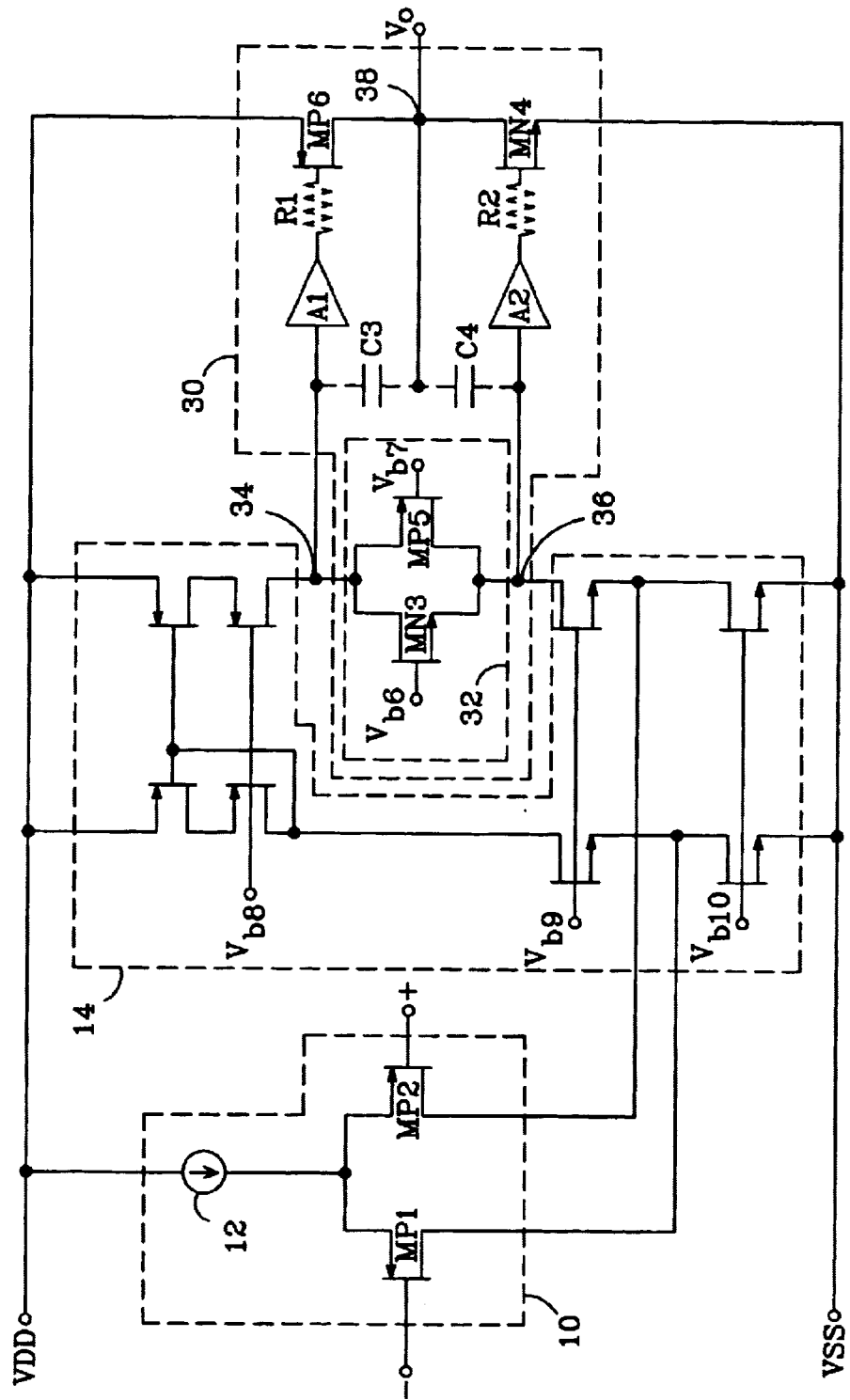
FIG. 2 is a schematic diagram of an op amp which includes an output stage in accordance with the present invention.

An op amp which includes an exemplary embodiment of an output stage in accordance with the present invention is shown in FIG. 2. As before, the op amp has an input stage 10 which produces a differential current in response to a differential input voltage applied to MP1 and MP2, and a gain stage 14 which is preferably arranged in a folded-cascode configuration (biased with bias voltages $V_{b8}$, $V_{b9}$, and $V_{b10}$).

Novel output stage 30 includes a current switch 32.

The current switch comprises an NMOS transistor MN3 and a PMOS transistor MP5, which receive respective bias voltages $V_{b6}$ and $V_{b7}$ and are connected between a pair of nodes 34 and 36. Nodes 34 and 36 are connected to receive the differential current from gain stage 14. When properly biased, MN3 and MP5 conduct equal currents when the differential current is zero. When the input stage drives the output stage in one direction, current is sourced into nodes 34 and 36, which causes the voltages at MP5's source and MN3's source to increase, the current in MP5 to increase, and the current in MN3 to decrease. When the input stage drives in the other direction, the voltage at MP5's source and MN3's source decreases, so that MP5's current falls and MN3's current increases. In this way, current switch 32 steers current from the MP5 leg to the MN3 leg, and vice-versa, such that the voltages developed at nodes 34 and 36 vary with the differential current received from input stage 10.

The output stage also includes a pair of buffer amplifiers A1 and A2. Buffer amplifiers A1 and A2 receive the voltages at nodes 34 and 36 at respective inputs, and drive output transistors MP6 and MN4 with respective outputs. A pair of resistors R1 and R2 might optionally be inserted between A1/A2 and MP6/MN4, respectively, which can add stability and/or design flexibility under some circumstances. MP6 and MN4 are connected in a back-to-back common-source configuration, with their drains connected together at a junction 38; junction 38 provides the op amp's output $V_o$. Output stage 30 preferably includes a frequency compensation scheme; one exemplary scheme is shown in FIG. 2, which has a first compensation capacitor C3 connected between node 34 and junction 38, and a second compensation capacitor C4 connected between node 36 and junction 38. Note that many other frequency compensation schemes are possible; most notably, the scheme shown in FIG. 2 with resistors connected in series with the capacitors.

Buffer amplifiers A1 and A2 provide a number of advantages over the prior art. A primary benefit provided by A1 and A2 is the buffering of the gate capacitances of output transistors MP6 and MN4. This mitigates the effect of the gate capacitances on the dynamic performance of the op amp. As such, larger output transistors having larger gate capacitances can be used without adverse impact. This is especially helpful if the output stage is used to drive large external FETs, which tend to have larger gate capacitances than do integrated FETs (on the order of nanofarads, as opposed to the picofarads). In the absence of buffer amplifiers A1 and A2, the gate capacitances can have a greater impact on the location of the dominant pole in the op amp's frequency response that do compensation capacitors C3 and C4 (if present). This makes the bandwidth of the op amp dependent on the particular output transistors used. The invention allows the compensation capacitors to be used to set the bandwidth—independently of the choice of output transistor.

Figure 1:
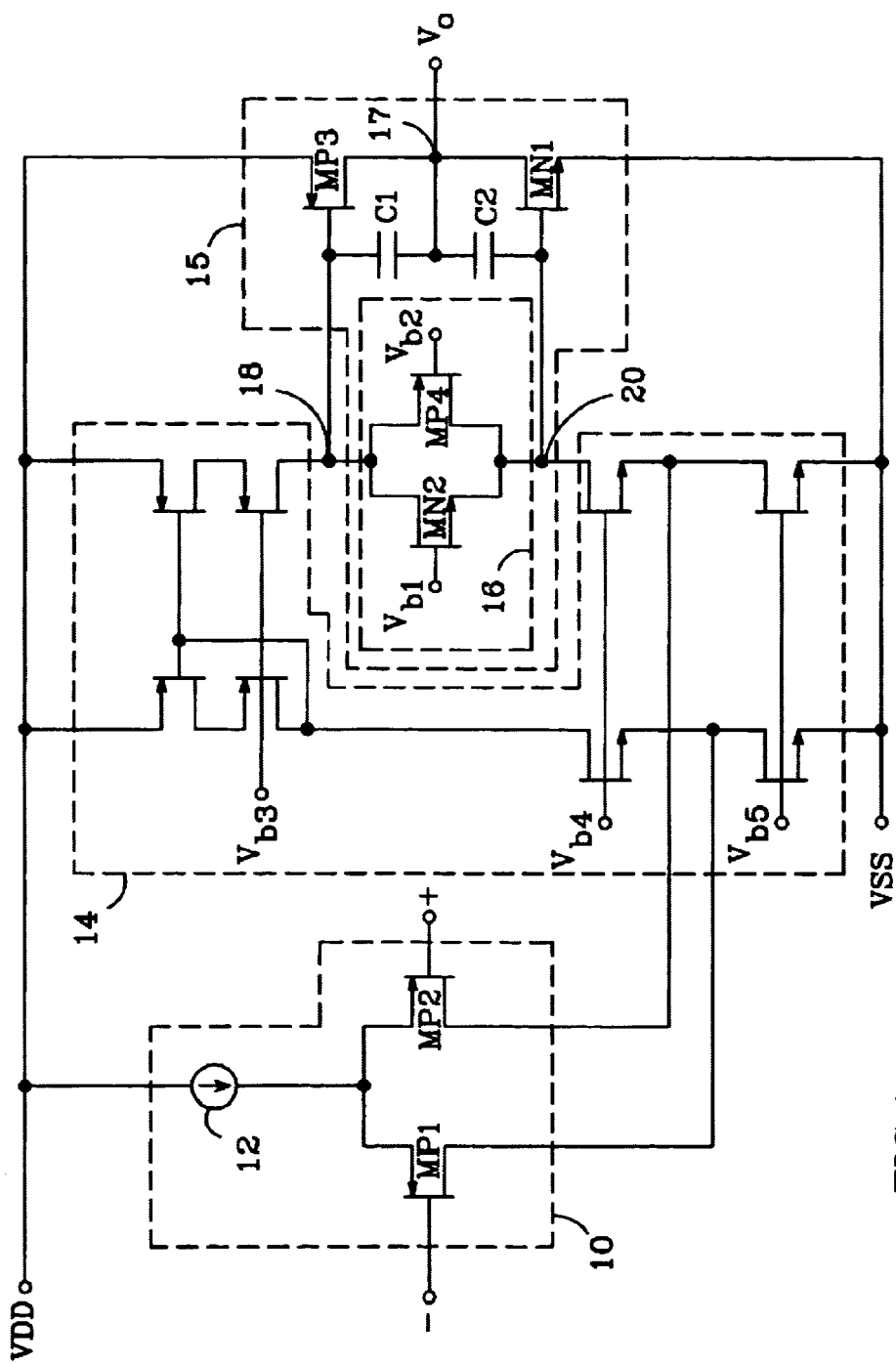
FIG. 1 is a schematic diagram of a known op amp.

The use of buffer amplifiers A1 and A2 also mitigates the effect of the output transistors' gate capacitances on the location of the secondary pole in the op amp's frequency response. With the conventional Monticelli architecture shown in FIG. 1, the frequency of the secondary pole location is roughly given by:

$$\frac{2g_m}{C_L} * \frac{1}{1 + \frac{C_{gs}}{C_c}}$$

where $g_m$ is the transconductance of the output transistors, $C_L$ is the capacitance of a load driven by the op amp, $C_{gs}$ is the gate-source capacitance of the output transistors, and $C_c$ is the capacitance of the compensation capacitors. (This presumes that the $g_m$'s and the $C_{gs}$'s are approximately the same for both output transistors, and that the $C_c$'s are approximately the same for both compensation capacitors. The frequency can be precisely calculated by those skilled in the art.) Buffer amplifier's A1 and A2 greatly reduce or eliminate the effect of $C_{gs}$, such that—with the invention in place—the expression for the secondary pole location reduces to $$\frac{2g_m}{C_L}.$$

This effectively moves the secondary pole—and thus the bandwidth's upper limit—to a higher frequency. One reason that this is useful is that, based on stability considerations, it is generally desired that the secondary pole be at a frequency two or three time higher than the frequency at which the op amp gain has a magnitude of one.

One prior art approach to moving the secondary pole to a higher frequency is to increase the size—and thus the transconductance $g_m$—of the output transistors. However, $g_m$ increases with roughly the square root of transistor size, while gate capacitance goes up proportionally to size. This can result in a $C_{gs}$ which is larger than $C_c$, which has the net effect of lowering the secondary pole location instead of increasing it as desired. With the invention in place, $C_{gs}$ is no longer a consideration, and the larger $g_m$ of a large output transistor has the desired effect of increasing the secondary pole location.

To further improve the secondary pole location, the buffer amplifiers are preferably arranged to provide a gain greater than one. For example, if the buffer amplifiers each have a gain of 2, the secondary pole location is given by $$4 * \frac{g_m}{C_L}.$$

This doubles the frequency of the secondary pole location, and thus allows for twice the bandwidth.

The buffer amplifiers can also be arranged to provide voltage level translation, which can prevent the output transistors from limiting the headroom of the gain stage of the amplifier. For example, assume the output transistors need to be biased with control voltages which are 0.7 volts from the supply voltages. At the same time, the gain stage of the amplifier must be biased so that its transistors remain in their forward active region. If the control voltages are 0.7 volts from the supply voltages, then the drop across the gain stage is constrained by the same amount (0.7 volts). This is known as the headroom. In general, the more headroom available to the gain stage, the better it performs. To overcome this' constraint, buffer amplifiers A1 and A2 can translate the voltage levels applied to the output transistors such that more headroom is provided to the gain stage. Translating the voltage levels with A1 and A2 reduces the significance of the output transistors' threshold voltages. If the threshold voltages are lower than desired, the buffer amplifiers can be arranged to add voltage drop in the level translation. Similarly, if the threshold voltages are higher than desired, the buffer amplifiers can be arranged to add a voltage step in the level translation.

Note that, though the op amp shown in FIG. 2 is implemented with FETs, the invention is applicable to use with a partial or all-bipolar implementation, or with a partial or all-BiCMOS implementation as well. Also note that, though the amplifier is usually biased to be used as a class A/B amplifier, the invention is equally applicable to situations where the amplifier is biased as a class A or class B amplifier.

Buffer amplifiers A1 and A2 have no special requirements, other than the need to be able to drive the capacitive load of the output transistors' gates out to a bandwidth necessitated by the design while maintaining sufficient stability margins. The buffer amplifiers preferably provide settable gain to obtain additional improvement in secondary pole location, and voltage translation to provide the previously discussed additional headroom.

Figure 3:
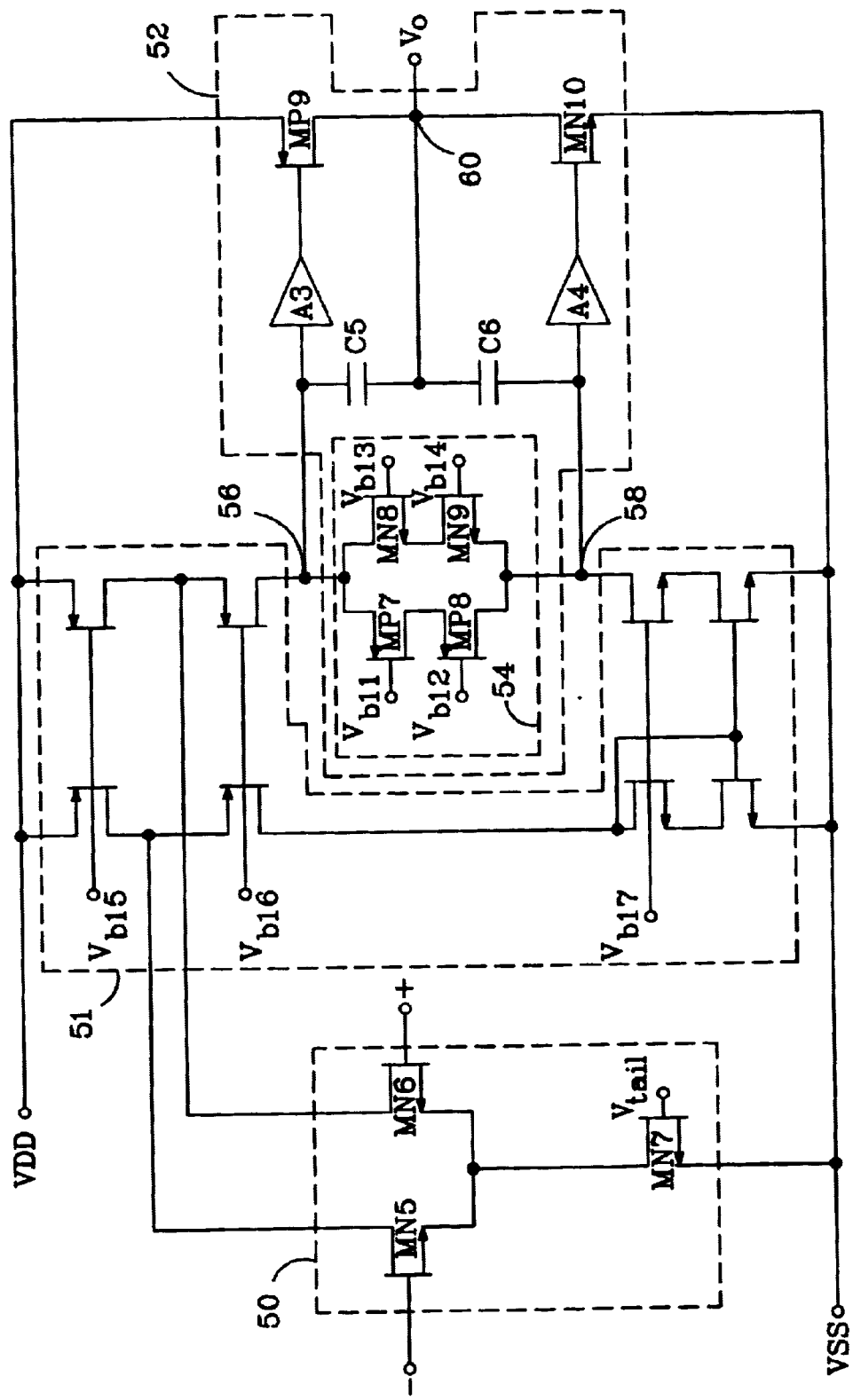
FIG. 3 is a schematic diagram of an op amp which includes another embodiment of an output stage in accordance with the present invention.

Another embodiment of an op amp per the present invention is shown in FIG. 3. Here, an input stage 50 comprises NMOS transistors MN5 and MN6, which receive tail current from an NMOS transistor MN7 biased with a voltage $V_{tail}$. The differential current produced by input stage 50 is connected to a folded-cascode gain stage 51, which drives an output stage 52. Output stage 52 includes a current switch 54 made from cascoded PMOS transistors MP7 and MP8 and cascoded NMOS transistors MN8 and MN9 (biased with bias voltages $V_{b11}$, $V_{b12}$, $V_{b13}$ and $V_{b14}$, respectively), connected between a pair of nodes 56 and 58. Nodes 56 and 58 are connected to the inputs of buffer amplifiers A3 and A4, respectively. A pair of output FETs MP9 and MN10 are connected in a back-to-back common-source configuration, with their drains connected together at a junction 60. MP9 and MN10 are driven by the outputs of A3 and A4, respectively; junction 60 provides the op amp's output $V_o$. A pair of compensation capacitors C5 and C6 are connected between junction 60 and nodes 56 and 58, respectively.

The op amp shown in FIG. 3 operates in the same fashion as that shown in FIG. 2. Input stage 50 converts a differential input voltage to a differential current which is delivered to gain stage 51. Current switch 54 receives the differential current and produces first and second voltages which vary with the differential current at nodes 56 and 58, respectively. The outputs of buffer amplifiers A3 and A4 vary with the first and second voltages, and output transistors MP9 and MN10 conduct respective currents to junction 60 in response to the outputs of A3 and A4. Buffer amplifiers A3 and A4 serve to buffer the gate capacitances of output transistors MP9 and MN10, thereby allowing the output FETs to be nearly any desired size without adversely affecting the op amp's dynamic performance. Buffer amplifiers A3 and A4 can also provide gain which effectively multiplies the transconductance of the output transistors and further extends out the secondary pole location. In addition, the buffer amplifiers can be used to provide level translation between the current switch and the output transistors, which can provide additional headroom for the gain stage.

Figure 4:
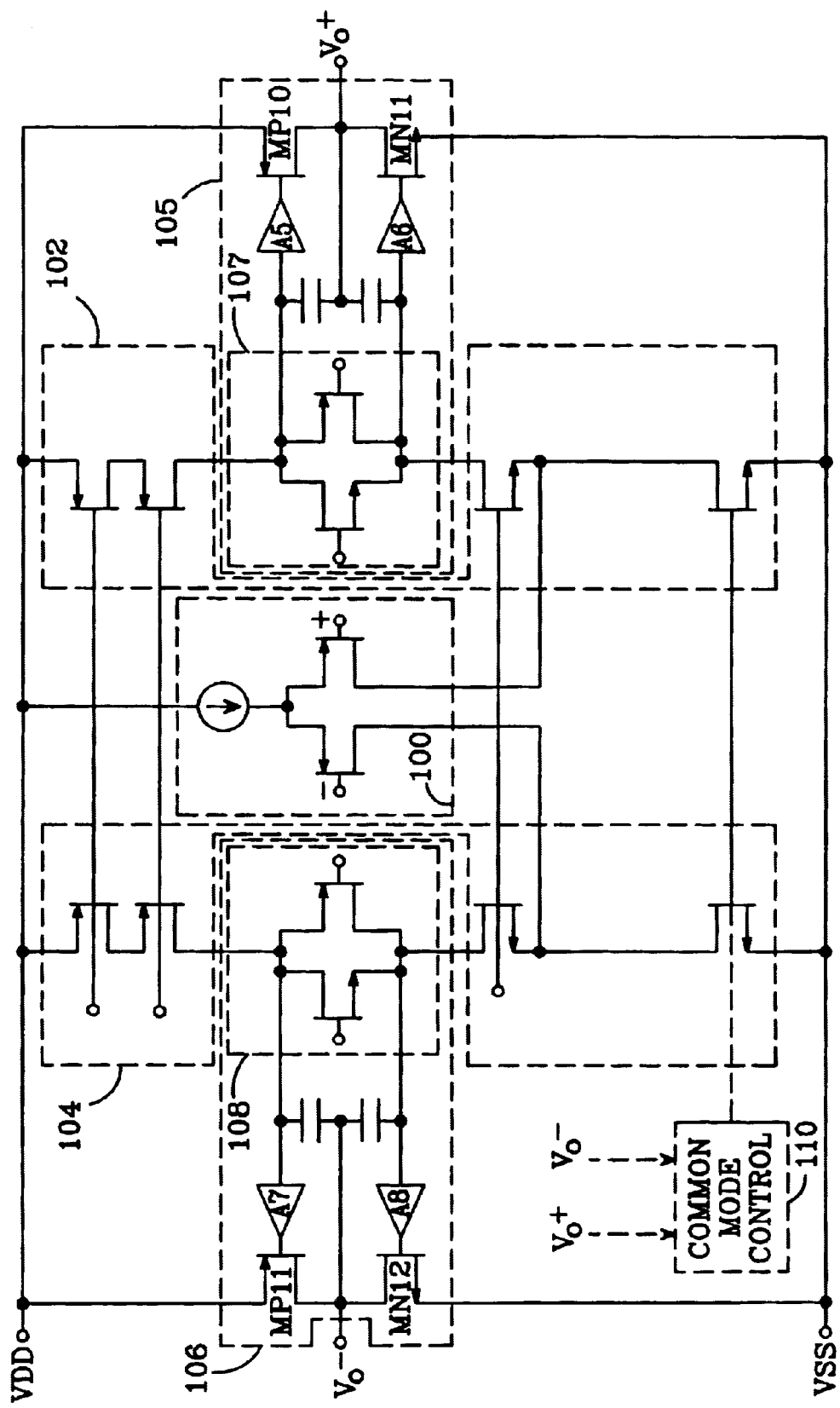
FIG. 4 is a schematic diagram of a fully differential op amp which includes an output stage in accordance with the present invention.

An exemplary embodiment of a fully differential op amp which includes output stages in accordance with the present invention is shown in FIG. 4. An input stage 100 delivers its differential current to first and second gain stages (102, 104), which in turn drive first and second output stages (105, 106) which include respective current switches (107, 108). The voltages developed across the current switches are delivered to the inputs of respective buffer amplifiers (A5–A8), the outputs of which drive respective output transistors (MP10/MN11; MP11/MN12) to produce a differential output voltage ($V_o+/V_o-$). The folded-cascode and current-switch transistors are biased with respective bias voltages (not shown), and the amplifier preferably includes a common-mode control circuit 110, which is connected to differential outputs $V_o+$ and $V_o-$ and provides common-mode feedback to the gain stages (typically connected to either the upper PMOS FETs or the lower NMOS FETs). Buffer amplifiers A5–A8 provide this op amp with the same benefits as were described above for the single-ended implementations. The advantages afforded by the present invention could also be realized with an op amp configured like that shown in FIG. 4, but which is implemented with bipolar or BiCMOS transistors.

The op amp implementations shown in FIGS. 2–4 are merely exemplary; the invention is useful with op amps which differ from those shown in numerous ways. It is only essential that the op amp configuration be based on the Monticelli architecture, with buffer amplifiers imposed between the output stage's current-switch and output transistors.

While particular embodiments of the invention have been shown and described, numerous variations and alternate embodiments will occur to those skilled in the art. Accordingly, it is intended that the invention be limited only in terms of the appended claims.

I claim:

1. An operational amplifier (op amp), comprising:
    an input stage which converts a differential input voltage to a differential current that varies with said differential input voltage, and
    an output stage, comprising:
        a current switch which receives said differential current and produces first and second voltages which vary with said differential current at first and second nodes, respectively,
        first and second buffer amplifiers which receive said first and second voltages and produce respective outputs which vary with said first and second voltages, and
        first and second complementary output transistors connected together at a common output node and arranged to conduct respective currents to said common output node in response to the outputs of said first and second buffer amplifiers, respectively, said common output node being the output of said op amp.

2. The op amp of claim 1, wherein said current switch comprises:
    an n-type transistor which receives a first bias voltage at its control input and has its current circuit connected between said first and second nodes, and
    a p-type transistor which receives a second bias voltage at its control input and has its current circuit connected between said first and second nodes, said differential current applied across said first and second nodes,
    said first and second bias voltages selected such that said n-type transistor and said p-type transistor conduct approximately equal currents when said differential current is zero.

3. The op amp of claim 1, wherein said output stage further comprises a frequency compensation scheme connected between said current switch and said common output node.

4. The op amp of claim 3, wherein said frequency compensation scheme comprises:
    a first compensation capacitor connected between said first node and said common output node, and
    a second compensation capacitor connected between said second node and said common output node.

5. The op amp of claim 1, further comprising a gain stage which comprises a plurality of transistors arranged in a folded-cascode configuration which conveys said differential current from said input stage to the first and second nodes of said current switch.

6. The op amp of claim 1, wherein said current switch comprises:
    first and second cascoded n-type transistors which receive first and second bias voltages at their respective control inputs and have their current circuits connected in series between said first and second nodes,
    first and second cascoded p-type transistors which receive third and fourth bias voltages at their respective control inputs and have their current circuits connected in series between said first and second nodes, said differential current applied across said first and second nodes,
    said first, second, third and fourth bias voltages selected such that said cascoded n-type transistors and said cascoded p-type transistors conduct approximately equal currents when said differential current is zero.

7. The op amp of claim 1, wherein said buffer amplifiers have a gain greater than one such that the transconductance of said output transistors is effectively multiplied.

8. The op amp of claim 1, wherein said buffer amplifiers provide voltage level translation such that the headroom of said gain stage is increased when compared with an op amp which provides no level translation between said current switch and said output transistors but which is otherwise identical.

9. The op amp of claim 1, wherein said buffer amplifiers provide voltage level translation which steps up said first and second voltages.

10. The op amp of claim 1, wherein said output transistors are field-effect transistors (FETs).

11. The op amp of claim 10, wherein said output transistors are connected between first and second supply voltages in a back-to-back common-source configuration.

12. The op amp of claim 1, wherein said output transistors are bipolar transistors.

13. The op amp of claim 1, wherein said output transistors have associated transconductances $g_m$ which are approximately equal, and said op amp drives a load having an associated capacitance $C_L$, said buffer amplifiers buffering the gate capacitance of said output transistors such that the location of the secondary pole in said op amp's frequency response is approximately given by:

$$\frac{2g_m}{C_L}.$$

14. The op amp of claim 1, wherein all of the transistors comprising said input and output stages are field-effect transistors (FETs).

15. The op amp of claim 1, wherein all of the transistors comprising said input and output stages are bipolar transistors.

16. The op amp of claim 1, wherein all of the transistors comprising said input and output stages' are BiCMOS transistors.

17. The op amp of claim 1, further comprising a first resistor connected between said first buffer amplifier and said first output transistor and a second resistor connected between said second buffer amplifier and said second output transistor.

18. An operational amplifier (op amp), comprising:
an input stage which converts a differential input voltage to a differential current which varies with said differential input voltage,
a gain stage comprising a plurality of field-effect transistors (FETs) arranged in a folded-cascode configuration which receives said differential current from said input stage, and
an output stage, comprising:
a current switch comprising:
at least one NMOS PET, said NMOS FETs receiving respective bias voltages at their gates and having their drain-source circuits connected in series between a first node and a second node,
at least one PMOS FET, said PMOS FETs receiving respective bias voltages at their gates and having their drain-source circuits connected in series between said first node and said second node, said differential current applied across said first and second nodes via said gain stage,
said bias voltages selected such that said cascoded NMOS FETs and said cascoded PMOS FETs conduct approximately equal currents when said differential current is zero, said current switch producing first and second voltages at said first and second nodes, respectively, which vary with said differential current,
first and second buffer amplifiers which receive said first and second voltages and produce respective outputs which vary with said first and second voltages,
first and second complementary output FETs connected in a back-to-back common-source configuration between first and second supply voltages, said first and second complementary output FETs arranged to conduct respective currents to their common output node in response to the outputs of said first and second buffer amplifiers, respectively, said common output node being the output of said operational amplifier, and
a frequency compensation scheme connected between said current-switch and said common output node.

19. The op amp of claim 18, wherein said buffer amplifiers have a gain greater than one such that the transconductance of said output FETs is effectively multiplied.

20. The op amp of claim 18, wherein said buffer amplifiers provide voltage level translation such that the headroom of said gain stage is increased when compared with an op amp which provides no level translation between said current switch and said output transistors but which is otherwise identical.

21. The op amp of claim 18, wherein said current switch's at least one NMOS FET comprises two cascoded NMOS FETs which receive respective bias voltages and are connected between said first and second nodes, and said current switch's at least one PMOS FET comprises two cascoded PMOS FETs which receive respective bias voltages and are connected between said first and second nodes, said bias voltages selected such that said cascoded NMOS FETs and said cascoded PMOS FETs conduct approximately equal currents when said differential current is zero.

22. The op amp of claim 18, wherein said frequency compensation scheme comprises:
a first compensation capacitor-connected between said first node and said common output node, and
a second compensation capacitor connected between said second node and said common output node.

23. The op amp of claim 18, further comprising a first resistor connected between said first buffer amplifier and said first output transistor and a second resistor connected between said second buffer amplifier and said second output transistor.

24. A fully differential operational amplifier (op amp), comprising:
an input stage which converts a differential input voltage to a differential current which varies with said differential input voltage, said differential current having first and second signal lines,
first and second gain stages, each of which comprises a plurality of field-effect transistors (FETs) arranged in a folded-cascode configuration and is connected to a respective one of said first and second differential current signal lines, and
first and second output stages, each of which comprises:
a current switch which receives the current on a respective one of said first and second differential current signal lines via a respective one of said gain stages and produces first and second voltages which vary with said received current at first and second nodes, respectively, first and second buffer amplifiers which receive said first and second voltages and produce respective outputs which vary with said first and second voltages, and first and second complementary output transistors connected together at a common output node and arranged to conduct respective currents to said common output node in response to the outputs of said first and second buffer amplifiers, respectively, the common output nodes of said first and second output stages being the outputs of said op amp.

25. The op amp of claim 24, wherein each of said output stages further comprises a frequency compensation scheme connected between its current switch and its common output node.

26. The op amp of claim 24, further comprising a common-mode control circuit which receives the outputs of said op amp at respective inputs and which is arranged to provide common-mode feedback to each of said gain stages.

* * * * *